United States Patent [19]

Kawakami et al.

[11] Patent Number: 5,236,736
[45] Date of Patent: Aug. 17, 1993

[54] METHOD FOR MANUFACTURING AN ELECTROMAGNETIC WAVE SHIELD PRINTED WIRING BOARD

[75] Inventors: Shin Kawakami; Hirotaka Okonogi; Katsutomo Nikaido; Yoshio Nishiyama, all of Iruma, Japan

[73] Assignee: Nippon CMK Corp., Japan

[21] Appl. No.: 775,827

[22] Filed: Oct. 11, 1991

[30] Foreign Application Priority Data

Oct. 15, 1990 [JP] Japan .................. 2-275973

[51] Int. Cl.⁵ ............................ C23C 26/00
[52] U.S. Cl. ...................... 427/96; 427/404; 427/405
[58] Field of Search .............. 427/96, 404, 405

[56] References Cited
U.S. PATENT DOCUMENTS

| | | | |
|---|---|---|---|
| 4,801,489 | 1/1989 | Nakagawa | 427/96 |
| 4,970,354 | 11/1990 | Iwasa | 427/96 |
| 5,030,800 | 7/1991 | Kawakami | 174/264 |
| 5,112,648 | 5/1992 | Okonogi | 427/96 |

Primary Examiner—Shrive Beck
Assistant Examiner—Vi D. Dang
Attorney, Agent, or Firm—Bruce L. Adams; Van C. Wilks

[57] ABSTRACT

A printed-wiring board shielded from electromagnetic wave radiation is made by forming a conductive circuit pattern on an insulating substrate, disposing a first insulating layer over the circuit pattern, forming a jumper wire over the first insulating layer and between connecting terminals of the conductive pattern, forming a second insulating layer covering the jumper wire and the first insulating layer, and disposing an electromagnetic wave shielding layer over the conductive pattern. The jumper wire is formed by a printing process using a conductive paste containing a conductive metal such as silver, carbon or copper. The shield layer is formed by a printing process using a conductive metal resin paste such as copper. The shield layer is protected by providing an overcoat layer over the shield layer.

12 Claims, 1 Drawing Sheet

METHOD FOR MANUFACTURING AN ELECTROMAGNETIC WAVE SHIELD PRINTED WIRING BOARD

FIELD OF THE INVENTION

The present invention is related to a method for manufacturing an electromagnetic wave shield printed wiring board wherein an electromagnetic wave shield layer is deposited on required portions of a conductive pattern.

The conventional printed wiring board is constructed by forming a conductive pattern on one or both sides of an insulating substrate, and thereafter covering the conductive pattern with an insulating layer without covering the electrical connecting portions of the conductive pattern.

Further, as shown in FIG. 2, in addition to the construction of a printed wiring board in which the conductive pattern 2 formed on the insulating substrate 1 is covered with insulating layer 3, a printed wiring board has been provided in which a jumper wire 4 formed with a conductive paste such as silver, carbon or copper paste is formed between connecting terminals 2a and 2b of the conductive pattern.

However, in the conventional printed wiring board, a required conductive pattern 2 is formed on one or both sides of an insulating substrate and jumper wire 4 is provided using a conductive paste such as silver, carbon or copper, and thus the conductive pattern density is very high and there is a disadvantage that it is susceptible to the adverse effects of electromagnetic wave noise.

SUMMARY OF THE INVENTION

Accordingly, the present invention was developed to solve the problems of the prior art, and has an object of providing a method of manufacturing a printed wiring board shielded from electromagnetic waves wherein an electromagnetic shield layer is disposed over the jumper wire through an insulating layer resulting in improved operation of the electrical circuit formed on the board and improved efficiency in implementing the shield layer.

DETAILED DESCRIPTION OF THE PREFERRED EMBODIMENT

An embodiment of the manufacturing method of the present invention is described in conjunction with the accompanying drawing.

Figure 1:
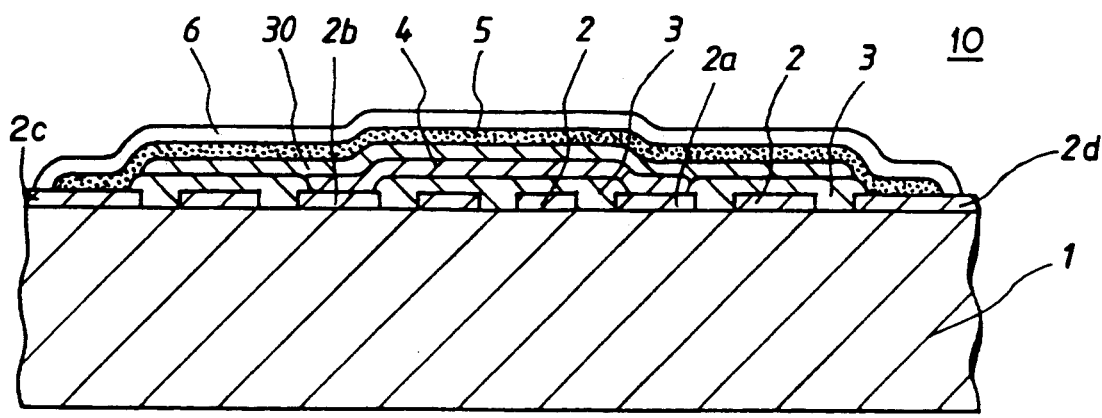
FIG. 1 is a sectional view showing the embodiment of the manufacturing method of the present invention.
Figure 2:
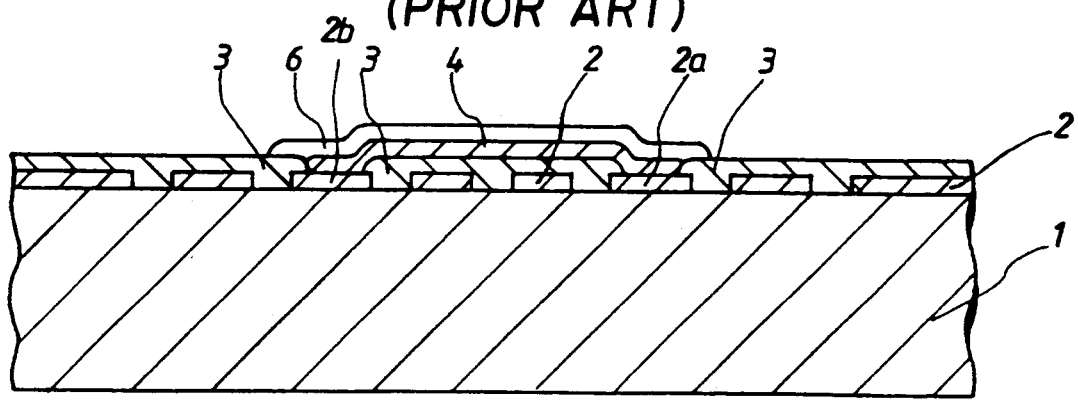
FIG. 2 is a sectional view of the conventional printed wiring board.

FIG. 1 is a sectional view of an electromagnetic wave shield printed wiring board manufactured according to the manufacturing method of the present invention.

First, conductive pattern 2 is formed on insulating substrate 1 by the conventional method.

That is, the conductive pattern 2 is formed by etching a single-sided copper-clad laminate.

Thereafter, insulating layer 3 is formed without covering the electrical connecting portions of the conductive pattern 2, that is, connecting terminals 2a and 2b of jumper wire 4 and earth circuit terminals 2c and 2d of shield layer 5.

This insulating layer 3 can be formed by depositing an insulating paste by silk printing and thereafter hardening it.

After the insulating layer 3 is formed, jumper wire 4 is deposited between connecting terminals 2a and 2b of the conductive pattern 2 and the jumper wire 4 is covered with an insulating layer 30. Thereafter a shield is provided by depositing shield layer 5 in the required portions or the whole surface above the conductive pattern 2, thereby forming the electromagnetic wave shield printed wiring board 10.

In addition, the jumper wire 4 insulating layer 30 covering the same, and shield layer 5 can be formed by a series of process steps by using a printing method such as silk printing, and thereafter hardening each printed layer.

Furthermore the jumper wire 4 is formed through printing using a conductive paste containing a conductive metal such as silver, carbon or copper, and the shield layer 5 is formed through printing using a conductive metallic resin paste such as copper.

The shield layer 5 is protected by covering it with an overcoat layer 6 as needed.

In accordance with the present invention, by covering the jumper wire susceptible to an undesirable radiation noise from the exterior with an electromagnetic wave shield layer, erroneous operation of the circuit in the conductive pattern can be prevented and the work of forming the jumper wire and the shield layer thereof can be implemented with good efficiency.

What is claimed is:

1. A method for manufacturing an electromagnetic wave shield printed wiring board, comprising the steps of: forming a conductive pattern containing connecting terminals on an insulating substrate, forming an insulating layer over said conductive pattern, forming a jumper wire from a conductive paste between the connecting terminals of said conductive pattern, forming a second insulating layer over said jumper wire, and forming a shield layer by disposing a conductive paste on said second insulating layer over said jumper wire.

2. A method for manufacturing an electromagnetic wave shield printed wiring board as set forth in claim 1; wherein the step of forming said shield layer comprises depositing a conductive metallic resin paste containing copper by the use of a printing method.

3. A method for manufacturing an electromagnetic wave shield printed wiring board as set forth in claim 1; wherein the step of forming said jumper wire comprises depositing a conductive metallic resin paste containing silver, carbon or copper by the use of a printing method.

4. A method for manufacturing an electromagnetic wave shield printed wiring board as set forth in claim 1 wherein the process step of forming said jumper wire and the shield layer thereof comprises depositing an insulating layer between the connecting terminals of said conductive pattern, thereafter wiring a jumper wire through printing by a conductive paste and covering the jumper wire with an insulating layer, and depositing a conductive paste to cover the shield layer and thereafter hardening said each deposited layer.

5. A method of manufacturing a printed wiring board shielded from electromagnetic waves, comprising:
providing an insulating substrate;

forming a conductive pattern having connecting terminals and at least one ground terminal on the insulating substrate;

deposing a first insulating layer on the conductive pattern;

forming a jumper wire between two connecting terminals of the conductive pattern and over the first insulating layer;

disposing a second insulating layer on the jumper wire; and disposing an electromagnetic wave shield layer over the conductive pattern to shield the conductive pattern and the jumper wire from electromagnetic waves.

6. A method of manufacturing a printed wiring board shielded from electromagnetic waves according to claim 5; wherein the first insulating layer is disposed to cover the entire conductive pattern except for the connecting terminals and the ground terminals.

7. A method of manufacturing a printed wiring board shielded from electromagnetic waves according to claim 5; wherein the jumper wire contains a conductive metal selected from a group consisting of silver, carbon and copper.

8. A method of manufacturing a printed wiring board shielded from electromagnetic waves according to claim 5; wherein the electromagnetic wave shield layer is formed using a conductive metal resin paste.

9. A method of manufacturing a printed wiring board shielded from electromagnetic waves according to claim 8; wherein the conductive metal resin paste contains copper.

10. A method of manufacturing a printed wiring board shielded from electromagnetic waves according to claim 5; including the step of disposing an overcoat layer over the electromagnetic wave shield layer.

11. A method of manufacturing a printed wiring board shielded from electromagnetic waves according to claim 5; wherein the second insulating layer is also disposed on the first insulating layer.

12. A method of manufacturing a printed wiring board shielded from electromagnetic waves according to claim 5; wherein the jumper wire, the second insulating layer and the electromagnetic wave shield layer are formed by printing.

* * * * *